(12) United States Patent
Watanabe et al.

(10) Patent No.: US 8,858,814 B2
(45) Date of Patent: Oct. 14, 2014

(54) PHOTOMASK BLANK, PROCESSING METHOD, AND ETCHING METHOD

(75) Inventors: Satoshi Watanabe, Joetsu (JP); Hideo Kaneko, Joetsu (JP); Ryuji Koitabashi, Joetsu (JP); Shinichi Igarashi, Joetsu (JP); Yoshio Kawai, Joetsu (JP); Shozo Shirai, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1061 days.

(21) Appl. No.: 12/732,637

(22) Filed: Mar. 26, 2010

(65) Prior Publication Data

US 2010/0248493 A1    Sep. 30, 2010

(30) Foreign Application Priority Data

Mar. 27, 2009 (JP) ................. 2009-078642

(51) Int. Cl.
| | |
|---|---|
| C23F 1/00 | (2006.01) |
| G03F 1/54 | (2012.01) |
| G03F 1/00 | (2012.01) |
| G03F 1/58 | (2012.01) |
| G03F 1/80 | (2012.01) |
| G03F 1/26 | (2012.01) |

(52) U.S. Cl.
CPC .. *G03F 1/58* (2013.01); *G03F 1/54* (2013.01); *G03F 1/14* (2013.01); *G03F 1/80* (2013.01); *G03F 1/26* (2013.01)
USPC .... 216/41; 216/47; 216/49; 430/5; 430/270.1

(58) Field of Classification Search
CPC ........... G03F 1/50; G03F 1/58; B81C 1/0038; B81C 2201/0198; B81C 1/00396
USPC ........................ 430/5, 270.1; 216/41, 47, 49
See application file for complete search history.

(56) References Cited

U.S. PATENT DOCUMENTS

| | | | |
|---|---|---|---|
| 7,625,676 B2 | 12/2009 | Yoshikawa et al. | |
| 2005/0277756 A1 | 12/2005 | Iwabuchi et al. | |
| 2007/0190459 A1* | 8/2007 | Hashimoto et al. | ........ 430/270.1 |
| 2007/0212619 A1 | 9/2007 | Yoshikawa et al. | |
| 2007/0238300 A1 | 10/2007 | Ogihara et al. | |
| 2008/0026322 A1 | 1/2008 | Ogihara et al. | |

FOREIGN PATENT DOCUMENTS

| | | | |
|---|---|---|---|
| EP | 1 832 926 A2 | 9/2007 |
| EP | 1 832 926 A3 | 9/2007 |
| EP | 1 845 132 A2 | 10/2007 |
| JP | 7-49558 A | 2/1995 |
| JP | 2006-146152 A | 6/2006 |
| JP | 2007-241060 A | 9/2007 |
| JP | 2007-302873 A | 11/2007 |
| JP | 2008-19423 A | 1/2008 |
| JP | 2008-26500 A | 2/2008 |

OTHER PUBLICATIONS

European Search Report for corresponding European Patent Application No. 10250516.1, dated Sep. 7, 2012.

* cited by examiner

*Primary Examiner* — Binh X Tran
(74) *Attorney, Agent, or Firm* — Birch, Stewart, Kolasch & Birch, LLP

(57) ABSTRACT

A photomask blank is provided comprising a transparent substrate, a single or multi-layer film including an outermost layer composed of chromium base material, and an etching mask film. The etching mask film is a silicon oxide base material film formed of a composition comprising a hydrolytic condensate of a hydrolyzable silane, a crosslink promoter, and an organic solvent and having a thickness of 1-10 nm. The etching mask film has high resistance to chlorine dry etching, ensuring high-accuracy processing of the photomask blank.

5 Claims, No Drawings

PHOTOMASK BLANK, PROCESSING METHOD, AND ETCHING METHOD

CROSS-REFERENCE TO RELATED APPLICATION

This non-provisional application claims priority under 35 U.S.C. §119(a) on Patent Application No. 2009-078642 filed in Japan on Mar. 27, 2009, the entire contents of which are hereby incorporated by reference.

TECHNICAL FIELD

This invention relates to a photomask blank from which a photomask is manufactured, especially a photomask blank comprising a substrate, a thin film, and a hard mask film, a method for processing the photomask blank, and a method for etching a thin film.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity effect correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shield pattern. In an attempt to miniaturize the light-shield pattern, if processing is carried out while maintaining the thickness of the resist film at the same level as in the art prior to the miniaturization, the ratio of film thickness to pattern width, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

As to the light-shielding film to be etched using the resist as an etching mask, a number of materials were proposed. Among others, chromium compound films are most often used in practice because their etching behaviors are well known and the standard process has been established. However, when it is desired to produce a mask for use in exposure for printing the desired pattern having a minimum line width of 45 nm, the process of etching a light-shielding film of chromium base material through a resist film which is made thin for the above reason becomes unlikely to ensure a sufficient processing accuracy.

One known method for dry etching a metal base material film using a thin film form of resist is by providing as an etching mask film a film which is resistant to dry etching conditions of the metal base material film and is dry etchable under conditions that cause relatively little damages to the resist film. As one example, JP-A 2007-241060 discloses that to enable dry etching of a light-shielding film of silicon base material using a thin film form of resist, a film of chromium base material having a thickness which is thin, but sufficient as the etching mask is used as the etching mask film. The resulting mask pattern is improved in accuracy. Also JP-A 2006-146152 discloses the use of a silicon base material film as a mask during etching of a chromium base light-shielding film.

With regard to the use of a silicon base material film as the mask during etching of a chromium base material film, JP-A 2008-026500 proposes the use of a silicon oxide base film of coating type, known as spin-on glass (SOG) film, rather than the film deposited by sputtering as mentioned above.

The SOG film has the advantage that a film having a high flatness is readily formed by spin coating and subsequent heating. An etching mask film can be formed at a very high efficiency as compared with the film deposition by sputtering. However, a problem arises when an SOG film is formed by heating a film of a quite common silicon oxide base polymer as disclosed in JP-A 2008-026500. The step of transferring the resist pattern by fluorine dry etching is very smooth as compared with the sputtered film. However, upon chlorine dry etching, this SOG film has poor etching resistance and thus fails to provide a sufficient accuracy in thin film form, resulting in a noticeable line edge roughness (LER). If the SOG film is made thick, there is an increased possibility that a residue problem arises upon stripping. Thus the mask processes using currently available SOG films as the etching mask film fail to achieve the desired level of accuracy.

CITATION LIST

Patent Document 1: JP-A 2007-241060 (US 2007212619, EP 1832926)
Patent Document 2: JP-A 2006-146152
Patent Document 3: JP-A 2008-026500
Patent Document 4: JP-A 2007-302873
Patent Document 5: JP-A 2008-019423

SUMMARY OF INVENTION

An object of the invention is to provide a photomask blank having a coated silicon oxide base film which has higher resistance to chlorine dry etching and enables high accuracy processing in thin film form, a method for processing the photomask blank, and a film etching method.

Making a study on SOG film materials which have sufficient etching resistance even in thin film form, the inventors have found that an SOG film formed from a composition comprising an SOG film-forming component and an agent capable of promoting Si—O—Si crosslinking in SOG film have sufficient resistance to chlorine dry etching even when its thickness is in a range of 1 to 10 nm, and is devoid of any problems upon stripping.

In one aspect, the invention provides a photomask blank comprising a transparent substrate, a film formed thereon, the film comprising one or more layers including an outermost layer composed of a chromium base material, and an etching mask film on the outermost layer serving as a mask upon dry etching. The etching mask film is deposited from a silicon oxide base material film-forming composition comprising (A) a hydrolytic condensate of a hydrolyzable silane compound, (B) a compound having the general formula (1) or (2), and (C) an organic solvent, and has a thickness of 1 to 10 nm.

$$L_a H_b X \quad (1)$$

Herein L is lithium, sodium, potassium, rubidium or cesium, X is a hydroxyl group or a mono- or polyfunctional organic acid group of 1 to 30 carbon atoms, a is an integer of at least 1, b is 0 or an integer of at least 1, and a+b is equal to the functionality of the hydroxyl or organic acid group.

$$MA \quad (2)$$

Herein M is tertiary sulfonium, secondary iodonium or quaternary ammonium, and A is a non-nucleophilic counter ion.

In a preferred embodiment, the hydrolyzable silane compound is a hydrolyzable silane compound having the general formula (3) alone or a mixture of two or more hydrolyzable silane compounds containing at least 70% on silicon basis of the hydrolyzable silane compound of formula (3).

$$R_n SiX_{4-n} \quad (3)$$

Herein R is hydrogen or an aliphatic hydrocarbon group of 1 to 12 carbon atoms or aromatic hydrocarbon group, X is an alkoxy group of 1 to 4 carbon atoms, halogen atom, or alkylcarbonyloxy group of 2 to 5 carbon atoms, and n is 0 or 1.

In another aspect, the invention provides a method for processing the photomask blank defined above, comprising the steps of:

forming a resist pattern on the photomask blank, effecting fluorine dry etching on the photomask blank through the resist pattern, for transferring the resist pattern to the etching mask film, and effecting chlorine dry etching on the photomask blank through the etching mask film pattern thus transferred, for transferring the pattern to the outermost layer of chromium base material.

In a further aspect, the invention provides a method for etching a film formed on a transparent substrate, the film comprising one or more layers including an outermost layer composed of a chromium base material, said method comprising chlorine dry etching using a silicon oxide base material film as an etching mask. The silicon oxide base material film is deposited from a film-forming composition comprising (A) a hydrolytic condensate of a hydrolyzable silane compound, (B) a compound having the general formula (1) or (2) defined above, and (C) an organic solvent, and has a thickness of 1 to 10 nm.

In a preferred embodiment, the hydrolyzable silane compound is a hydrolyzable silane compound of formula (3) defined above alone or a mixture of two or more hydrolyzable silane compounds containing at least 70% on silicon basis of the hydrolyzable silane compound of formula (3).

ADVANTAGEOUS EFFECTS OF INVENTION

The photomask blank includes the etching mask film having higher resistance to chlorine dry etching. The etching mask film permits the photomask blank to be processed by etching. The etching mask film, though it is a thin film, ensures high accuracy processing even by chlorine dry etching.

DESCRIPTION OF EMBODIMENTS

In this disclosure, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not.

In processing of a photomask blank having a molybdenum silicide or chromium base material film which is deposited by sputtering, a resist pattern is transferred to the film by etching. However, the etching selectivity between the resist and the film is not fully high. As the resist film is reduced in thickness in accordance with the progress of miniaturization, another important issue is how to insure processing accuracy.

For a high accuracy of pattern formation, the method employing the hard mask technology in the manufacture of photomasks has long been adopted. For example, in processing of a halftone phase shift film of molybdenum silicide base material, a resist pattern is once transferred to a light-shielding film of chromium base material deposited on the halftone phase shift film, and the resultant pattern is then transferred to the halftone phase shift film. To comply with the ever-tightening demand for minimization, the use of a hard mask in processing of a light-shielding film itself is also proposed.

The SOG film is often employed in the fabrication of semiconductor devices as a hard mask film which advantageously performs during the process, because a silicon oxide base film having a high flatness even when relatively thick can be formed simply by coating a SOG film-forming liquid onto a substrate and sintering. Also in processing of photomasks, it is proposed in JP-A 2008-026500 to use the SOG film as an etching mask film when a chromium base material film is processed.

Nevertheless, the inventors confirmed that if a general SOG film is actually used as an etching mask film in processing of chromium base material, the SOG film has insufficient resistance to chlorine dry etching of the chromium base material, resulting in the transferred pattern with increased LER. The problem of etching resistance may be solved in principle by increasing the thickness of etching mask film. An etching mask film of substantial thickness, however, has a more risk that residues are left upon removal of unnecessary film. Part of the film material which must be removed after pattern transfer can be left behind, that is, so-called black defects become increased.

The invention uses a silicon oxide base material film-forming composition (also referred to as SOG film-forming composition) comprising (A) a hydrolytic condensate of a hydrolyzable silane compound, (B) a compound having the general formula (1) or (2):

$$L_aH_bX \quad (1)$$

wherein L is lithium, sodium, potassium, rubidium or cesium, X is a hydroxyl group or a mono- or polyfunctional organic acid group of 1 to 30 carbon atoms, a is an integer of at least 1, b is 0 or an integer of at least 1, and a+b is equal to the functionality of the hydroxyl or organic acid group, $$MA \quad (2)$$

wherein M is tertiary sulfonium, secondary iodonium or quaternary ammonium, and A is a non-nucleophilic counter ion, and (C) an organic solvent.

A variety of condensates are known as the hydrolytic condensate of a hydrolyzable silane compound which can be used for SOG film formation. In the inventive composition, a variety of hydrolytic condensates may be used. Preferred are hydrolytic condensates of hydrolyzable silane compounds containing a compound having the general formula (3):

$$R_nSiX_{4-n} \quad (3)$$

wherein R is hydrogen or an optionally substituted aliphatic hydrocarbon group of 1 to 12 carbon atoms or optionally substituted aromatic hydrocarbon group, X is an alkoxy group of 1 to 4 carbon atoms, halogen atom, or alkylcarbonyloxy group of 2 to 5 carbon atoms, and n is 0 or 1.

In formula (3), X is a hydrolyzable group which is converted through hydrolytic reaction to a silanol group which in turn, undergoes condensation reaction. Specifically, X is selected from $C_1$-$C_4$ alkoxy groups, halogen atoms such as chlorine, and $C_2$-$C_5$ alkylcarbonyloxy groups. Of these, $C_1$-$C_4$ alkoxy groups are preferred since the corresponding compounds are readily available and form clean products as compared with halogen. Exemplary alkoxy groups include methoxy and ethoxy as well as propoxy and butoxy groups inclusive of structural isomers. Exemplary $C_2$-$C_5$ alkylcarbonyloxy groups include acetoxy, and propionyloxy, butyryloxy and pentylyloxy groups inclusive of structural isomers of the alkyl moiety.

In formula (3), R is hydrogen or an aliphatic hydrocarbon group of 1 to 12 carbon atoms or aromatic hydrocarbon group. Suitable aliphatic hydrocarbon groups include alkyl, alkenyl and alkynyl groups, which may be straight, branched or cyclic, and also include aromatic-substituted groups such as aralkyl groups. The aliphatic and aromatic hydrocarbon groups may further include substituted forms of such groups in which one or more hydrogen atoms are substituted by substituents. The aliphatic and aromatic hydrocarbon groups may further include such groups in which —O—, —CO—, —COO—, —COO— or —OCOO— intervenes between carbon atoms.

Suitable groups of R are exemplified in JP-A 2007-302873 and JP-A 2008-019423, and any of such groups may be used herein. Preferred examples include hydrogen, aliphatic hydrocarbon groups, typically alkyl groups such as methyl and ethyl as well as propyl, butyl, pentyl and hexyl groups inclusive of structural isomers, cycloalkyl groups such as cyclohexyl, alkenyl groups such as vinyl and allyl, aromatic hydrocarbon groups such as phenyl. Suitable substituents include halogen atoms such as fluorine, chlorine, bromine and iodine, alkoxy groups such as methoxy and ethoxy, acyl, acyloxy, epoxy, ester, hydroxyl, and lactone.

The hydrolyzable silane compounds having formula (3) may be used alone or in a mixture of two or more. From the standpoints of low cost, high performance and stable quality, it is preferred that the content of the hydrolyzable silane compound of formula (3) be at least 70% on silicon basis.

In addition to the hydrolyzable silane compound having formula (3), a difunctional hydrolyzable silane compound of formula (3) wherein n is 2 and a monofunctional hydrolyzable silane compound may be used, if in a minor amount. Since these silane compounds tend to detract from the etching resistance of SOG film, their content is preferably reduced to or below 30 mol % on silicon basis. There may also be used hydrolyzable silanes containing a plurality of silicon atoms as described in JP-A 2007-302873 and JP-A 2008-019423.

In accordance with any well-known techniques as described in JP-A 2007-302873 and JP-A 2008-019423, the foregoing hydrolyzable silane compound or compounds may be hydrolyzed and condensed in water in the presence of an acid or alkali catalyst to form a condensate. To acquire higher etching resistance, a condensate produced in the presence of an acid catalyst is preferably used as the major component. That is, only a condensate resulting from an acid catalyst is used, or a mixture of a higher weight fraction of a condensate resulting from an acid catalyst and a lower weight fraction of a condensate resulting from an alkali catalyst is used. Hereinafter, the hydrolyzable silane compound is sometimes referred to as "silicon monomer."

Examples of the acid catalyst used for hydrolytic condensation include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. An appropriate amount of the catalyst used is in the range of $10^{-6}$ to 10 moles, more preferably $10^{-5}$ to 5 moles, and even more preferably $10^{-4}$ to 1 mole per mole of the silicon monomer.

An appropriate amount of water used for hydrolytic condensation of the hydrolyzable silane compound to produce a condensate is in the range of 0.01 to 100 moles, more preferably 0.05 to 50 moles, and even more preferably 0.1 to 30 moles per mole of the hydrolyzable substituent group attached to the hydrolyzable silane compound. Addition of more than 100 moles of water is uneconomical because an extra large reaction system must be used.

In performing hydrolysis, a silicon monomer is added to a catalyst aqueous solution whereupon hydrolytic condensation reaction is commenced. At this point, an organic solvent may have been added to the catalyst aqueous solution and/or the monomer may have been diluted with an organic solvent. The reaction temperature is in a range of 0 to 100° C., and preferably 5 to 80° C. In a preferred procedure, the temperature is kept in a range of 5 to 80° C. during dropwise addition of the monomer, and the solution is then matured at a temperature of 20 to 80° C.

The organic solvent which may be added to the catalyst aqueous solution or with which the hydrolyzable silane compound may be diluted may be selected from well-known solvents, preferably water-soluble solvents. Suitable solvents include alcohols such as methanol, ethanol, 1-propanol and 2-propanol, polyhydric alcohols such as ethylene glycol and propylene glycol, polyhydric alcohol condensed derivatives such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, acetonitrile, and tetrahydrofuran. Of these, those solvents having a boiling point lower than or equal to 100° C. are preferred. An appropriate amount of the solvent used is in the range of 0 to 1,000 ml, more preferably 0 to 500 ml per mole of the monomer. A larger amount of the solvent is uneconomical because an extra large reaction system must be used.

Thereafter, the catalyst is neutralized if necessary, and the alcohol formed by the hydrolytic condensation reaction is removed in vacuum, yielding the reaction mixture in aqueous solution form. Any alkaline substances which become alkaline in water may be used for neutralization. An appropriate amount of the alkaline substance used is 0.1 to 2 equivalents relative to the acid used as the catalyst.

The resulting reaction solution (or condensate) may be purified by removing the catalyst in a well-known manner, for example, by washing and separation as described in JP-A 2007-302873 and JP-A 2008-019423. In a general course, the reaction solution may be converted into a coating composition, without a need to recover the condensate as isolated, by removing in vacuum the alcohol or byproducts resulting from the reaction and simultaneously exchanging it with a coating solvent.

In the event that the silicon-containing compound becomes unstable upon solvent exchange, a stabilizer may be added to the reaction mixture. The stabilizer is preferably selected from mono or polyfunctional organic acids of 1 to 30 carbon atoms. Preferred examples of the stabilizer include oxalic acid, maleic acid, formic acid, acetic acid, propionic acid, and citric acid. A mixture of two or more acids may be used to maintain stability. An appropriate amount of the stabilizer is 0.001 to 25 parts, more preferably 0.01 to 15 parts, and even more preferably 0.1 to 5 parts by weight relative to 100 parts by weight of the silicon-containing compound in the composition.

Component (B) in the silicon oxide base material film-forming composition is at least one crosslink promoter selected from compounds having the general formulae (1) and (2).

$$L_a H_b X \tag{1}$$

Herein L is lithium, sodium, potassium, rubidium or cesium, X is a hydroxyl group or a mono- or polyfunctional organic acid group of 1 to 30 carbon atoms, a is an integer of at least 1, b is 0 or an integer of at least 1, and a+b is equal to the functionality of the hydroxyl or organic acid group.

$$MA \tag{2}$$

Herein M is tertiary sulfonium, secondary iodonium or quaternary ammonium, and A is a non-nucleophilic counter ion. The addition of the crosslink promoter endows the silicon oxide base material film with sufficient resistance to chlorine dry etching, even in thin film form.

Suitable compounds of formula (1) include alkali metal hydroxides and alkali metal organic acid salts. Examples include lithium, sodium, potassium, rubidium, and cesium hydroxides, and monofunctional salts of lithium, sodium, potassium, rubidium, and cesium with formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, and trichloroacetic acid, and mono- or difunctional salts of lithium, sodium, potassium, rubidium, and cesium with oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and carbonic acid.

Suitable compounds of formula (2) include sulfonium, iodonium, and ammonium compounds having the following formulae (Q-1), (Q-2), and (Q-3), respectively.

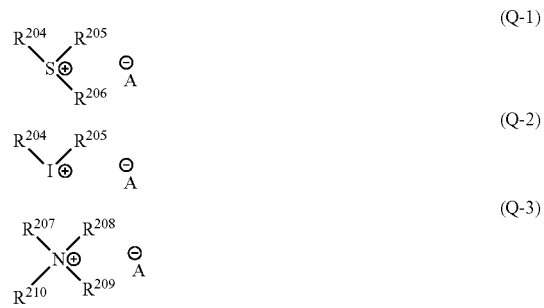

Herein, $R^{204}$, $R^{205}$, and $R^{206}$ are independently a straight, branched or cyclic alkyl, alkenyl, oxoalkyl or oxoalkenyl group of 1 to 12 carbon atoms, a substituted or unsubstituted aryl group of 6 to 20 carbon atoms, or an aralkyl or aryloxoalkyl group of 7 to 12 carbon atoms, in which some or all hydrogen atoms may be substituted by alkoxy or other groups. $R^{205}$ and $R^{206}$ may form a ring together, and in ring forming case, each is a $C_1$-$C_6$ alkylene group. $A^-$ is a non-nucleophilic counter ion. $R^{207}$, $R^{208}$, $R^{209}$, and $R^{210}$ are as defined for $R^{204}$, $R^{205}$, and $R^{206}$ or may be hydrogen. $R^{207}$ and $R^{208}$, or $R^{207}$, $R^{208}$, and $R^{209}$ may form a ring together, and in ring forming case, each is a $C_3$-$C_{10}$ alkylene group.

The foregoing $R^{204}$, $R^{205}$, $R^{206}$, $R^{207}$, $R^{208}$, $R^{209}$, and $R^{210}$ may be the same or different. For example, suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Suitable aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Suitable aralkyl groups include benzyl, phenylethyl, and phenethyl. Suitable aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by $A^-$ include monovalent ions such as hydroxyl, formate, acetate, nitrate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, trichloroacetate, fluoride, chloride, bromide, and iodide ions; and mono- or divalent ions such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, and carbonate ions.

The crosslink promoter may be used alone or in admixture of two or more. An appropriate amount of crosslink promoter (B) added is 0.01 to 50 parts, more preferably 0.1 to 40 parts by weight relative to 100 parts by weight of component (A) in the silicon oxide base material film-forming composition.

In the silicon oxide base material film-forming composition, component (C) is an organic solvent serving as a coating solvent. The organic solvent used in the preparation of the silicon-containing compound may be used as such. Preferred solvents used herein include monoalkyl ethers such as ethylene glycol, diethylene glycol, triethylene glycol, propylene glycol, and dipropylene glycol. More preferably, the solvent is selected from propylene glycol monomethyl ether, ethylene glycol monomethyl ether, propylene glycol monoethyl ether, ethylene glycol monoethyl ether, propylene glycol monopropyl ether, and ethylene glycol monopropyl ether. If necessary, the organic solvent may be used for additional dilution.

In addition to the solvent, any well-known stabilizing solvent components such as water may be added. To deposit a silicon oxide base material layer of 1 to 10 nm thick on a photomask blank of 152 mm (6 inches) square, the amount of entire solvents including water is preferably 1,000 to 250,000 parts, more preferably 10,000 to 200,000 parts by weight relative to 100 parts by weight of component (A).

Further, a stabilizer is preferably added to the silicon oxide base material film-forming composition in order that the composition be shelf stable and kept ready for use. Suitable stabilizers include mono- or polyfunctional organic acids of 1 to 30 carbon atoms. Exemplary acids which can be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Inter alia, oxalic acid, maleic acid, formic acid, acetic acid, propionic acid and citric acid are preferred. A mixture of two or more acids may be used to maintain stability. An appropriate amount of the stabilizer added is 0.001 to 25 parts, more preferably 0.01 to 15 parts, even more preferably 0.1 to 5 parts by weight relative to 100 parts by weight of component (A). Also preferably the organic acid is added in such amounts that the composition may have a pH value from 0 to 7, more preferably from 0.3 to 6.5, and even more preferably from 0.5 to 6.

The silicon oxide base material film-forming composition prepared above is applied to a film-bearing substrate by any well-known techniques such as spin coating and heat treated to form a silicon oxide base material film having a thickness of 1 to 10 nm. This results in a photomask blank having the silicon oxide base material film as an etching mask film.

While this film deposition procedure includes coating and heating steps, the heating step serves to induce Si—O—Si crosslinking in a sufficient density. The preferred heating conditions include a temperature of 100 to 400° C. and a time of 60 to 1,200 seconds. Since the crosslink promoter is contained in the silicon oxide base material film-forming composition as component (B), heating at a temperature of up to 300° C. which has no detrimental impact to the optical film or other film underlying the etching mask film involved in the photomask blank is sufficient to achieve a crosslinking density and resistance to dry etching of chromium base material.

The film resulting from the above procedure has a thickness of 1 to 10 nm. A film thickness of at least 1 nm ensures that even when a chromium base material layer having a thickness of about 100 nm is processed by oxygen-containing chlorine dry etching, the film displays sufficient etching resistance to avoid an increase of LER. A film thickness of up to 10 nm ensures that when the film is later stripped by dry etching, formation of black defects due to residues is avoided.

The photomask blank of the invention comprises a transparent substrate, typically quartz substrate, a film formed thereon, the film comprising one or more layers including an outermost layer composed of a chromium base material, and an etching mask film in the form of the silicon oxide base material film on the outermost layer.

The outermost layer which is overlaid with the silicon oxide base material film is composed of a chromium base material, typically metallic chromium or a chromium compound. The chromium compound film may be either a light-shielding film or an etching mask film for processing a silicon compound film optionally containing a transition metal. Since the silicon oxide base material film in either case serves an identical function of etching mask film during dry etching of the chromium compound film, the following description refers to the embodiment wherein the chromium compound film is a light-shielding film.

In the embodiment wherein the photomask blank has a light-shielding film of chromium base material, the photomask blank may be intended for binary masks or for phase shift masks. In the case of a binary mask-forming photomask blank, the light-shielding film may include an antireflective layer and a light-shielding layer wherein both the layers may be of chromium base materials, or an entire antireflective film on the outer surface side may be formed of chromium base material, or only a surface layer of the antireflective film on the outer surface side may be formed of chromium base material and the underlying layer(s) be formed of a silicon compound material optionally containing a transition metal. In the case of a phase shift mask-forming photomask blank, a photomask blank having a chromium base light-shielding film on a phase shift film is contemplated.

Photomask blanks having an outermost layer of chromium base material are well known as described in JP-A 2008-026500 and JP-A 2007-302873 and the references cited therein. Although the detail description is omitted herein, the following layer construction may be employed when a light-shielding film including an antireflective layer and a light-shielding layer is composed of chromium base materials.

In the example where a light-shielding film including an antireflective layer and a light-shielding layer is composed of chromium base materials, layers may be stacked in the order of an antireflective layer and a light-shielding layer from the outer surface side, or layers may be stacked in the order of an antireflective layer, a light-shielding layer, and an antireflective layer from the outer surface side. Each of the antireflective layer and the light-shielding layer may be composed of multiple sub-layers. When the sub-layers have different compositions, the composition may be graded discontinuously or continuously from sub-layer to sub-layer. The chromium base material used herein may be metallic chromium or a material consisting of metallic chromium and a light element such as oxygen, nitrogen or carbon. Examples used herein include metallic chromium, chromium oxide, chromium nitride, chromium carbide, chromium oxynitride, chromium oxycarbide, chromium nitride carbide, and chromium oxide nitride carbide.

The chromium base material of which the light-shielding film is formed may preferably have a composition consisting essentially of 50 to 100 atom %, more preferably 60 to 100 atom % of chromium, 0 to 50 atom %, more preferably 0 to 40 atom % of oxygen, 0 to 50 atom %, more preferably 0 to 40 atom % of nitrogen, and 0 to 20 atom %, more preferably 0 to 10 atom % of carbon.

The chromium compound of which the antireflective film is formed may preferably have a composition consisting essentially of 30 to 70 atom %, more preferably 35 to 50 atom % of chromium, 0 to 60 atom %, more preferably 20 to 60 atom % of oxygen, 0 to 50 atom %, more preferably 3 to 30 atom % of nitrogen, and 0 to 20 atom %, more preferably 0 to 5 atom % of carbon.

Preferably the light-shielding layer has a thickness of 10 to 100 nm. If the thickness is less than 10 nm, a sufficient light-shielding effect may not be exerted, though depending on the construction of the light-shielding layer. If the thickness is more than 100 nm, there may occur a problem of side etching and a lowering of processing accuracy like a dimensional change of pattern due to the proximity bias effect.

The antireflective film exerts the desired antireflective effect when it generally has a thickness of 5 to 50 nm, preferably 10 to 30 nm, though the thickness varies with the wavelength of light used during fabrication of a photomask or for inspection necessary during use of a photomask. Particularly for the ArF excimer laser lithography, the antireflective film has a thickness of 15 to 25 nm.

Through adjustment of its composition and thickness, the light-shielding film may have an optical density of at least 2.0, more preferably from 2.5 to 4, when intended for binary masks. Likewise, the light-shielding film combined with the halftone phase shift film may have an optical density of at least 2.0, more preferably from 2.5 to 4 when intended for halftone phase shift masks. Also through adjustment of its composition and thickness, the antireflective layer may have a reflectance of up to 20% with respect to exposure light and inspection light.

In the embodiment wherein the light-shielding film is entirely composed of chromium base material, for example, the photomask blank is processed as follows.

First, a resist film is formed on a photomask blank having a light-shielding film of chromium base material and a silicon oxide base material film deposited thereon. The resist used herein may be selected in accordance with a particular pattern exposure method. Since the electron beam (EB) lithography is generally employed to form a fine pattern to which the photomask blank of the invention is applicable, a chemically amplified EB resist comprising an aromatic resin is typically used. Either positive or negative resist may be selected depending on the type of pattern. The resist film is irradiated patternwise with EB, followed by PEB and development which also depend on the type of resist used, to form a resist pattern.

The resist pattern is transferred to the silicon oxide base material film by dry etching. The dry etching may be standard dry etching in fluorine-containing gas. Examples of the fluorine-containing gas include fluorine gas, carbon and fluorine-containing gas such as $CF_4$ and $C_2F_6$, and sulfur and fluorine-containing gas such as $SF_6$. A mixture of a fluorine-free gas such as helium and a fluorine-containing gas is also useful. Oxygen or another gas may be added if necessary.

Next, the resist film is stripped off by oxygen plasma, if necessary. Using the resultant pattern of silicon oxide base material as an etching mask, the pattern is transferred to the light-shielding film of chromium base material by dry etching. The pattern may also be transferred using both the patterns of resist film and silicon oxide base material film as a mask. The dry etching may be standard oxygen-containing chlorine dry etching. Dry etching conditions include a mixture of chlorine and oxygen gases in a volume flow rate ratio ($Cl_2:O_2$) of 1:2 to 20:1, optionally in an inert gas such as helium.

During the oxygen-containing chlorine dry etching, the pattern of silicon oxide base material despite a thin film exhibits high etching resistance due to a high Si—O—Si crosslinking density. This ensures high accuracy transfer of the pattern.

Once the light-shielding pattern is completed by the dry etching, the pattern of silicon oxide base material is stripped off. This stripping may be carried out by wet etching like ordinary SOG films. Since the film is as thin as 1 to 10 nm, the pattern may also be stripped by the dry etching, without leaving any residues.

EXAMPLE

Synthesis Examples, Examples and Comparative Examples are given below by way of illustration and not by way of limitation.

Synthesis of Silicon-Containing Compound
(Hydrolytic Condensate of Hydrolyzable Silane)

Synthesis Example 1

A 1000-ml glass flask was charged with 60 g of methanol, 200 g of deionized water, and 1 g of 35% hydrochloric acid. A mixture of 50 g of tetraethoxysilane, 100 g of methyltrimethoxysilane, and 10 g of phenyltrimethoxysilane was added thereto at room temperature. The mixture was held at room temperature for 8 hours for hydrolytic condensation, after which methanol and byproduct ethanol were distilled off in vacuum. Then 800 ml of ethyl acetate and 300 ml of propylene glycol monopropyl ether were added, and the water layer was separated off for removal of the hydrochloric acid used in reaction. To the remaining organic layer, 100 ml of 1% maleic acid aqueous solution was added, followed by stirring, static holding and separation. This was repeated twice. To the organic layer, 100 ml of deionized water was added, followed by stirring, static holding and separation. This was repeated three times. Propylene glycol monopropyl ether, 200 ml, was added to the organic layer, which was concentrated in vacuum, yielding 300 g of a propylene glycol monopropyl ether solution of silicon-containing compound #1 (polymer concentration 21%). The solution was analyzed by ion chromatography, but no chloride ions detected. Silicon-containing compound #1 had a weight average molecular weight (Mw) of 2,000 versus polystyrene standards.

Synthesis Example 2

The procedure of Synthesis Example 1 was repeated except that a mixture of 100 g of methyltrimethoxysilane and 20 g of phenyltrimethoxysilane was used instead of the mixture of 50 g of tetraethoxysilane, 100 g of methyltrimethoxysilane, and 10 g of phenyltrimethoxysilane. There was obtained 300 g of a propylene glycol monopropyl ether solution of silicon-containing compound #2 (polymer concentration 19%). The solution was analyzed by ion chromatography, but no chloride ions detected. Silicon-containing compound #2 had a weight average molecular weight (Mw) of 3,000 versus polystyrene standards.

Synthesis Example 3

The procedure of Synthesis Example 1 was repeated except that 260 g of deionized water, 5 g of 65% nitric acid, 70 g of tetramethoxysilane, 70 g of methyltrimethoxysilane, and 10 g of phenyltrimethoxysilane were used instead of 60 g of methanol, 200 g of deionized water, 1 g of 35% hydrochloric acid, 50 g of tetraethoxysilane, 100 g of methyltrimethoxysilane, and 10 g of phenyltrimethoxysilane. There was obtained 300 g of a propylene glycol monopropyl ether solution of silicon-containing compound #3 (polymer concentration 20%). The solution was analyzed by ion chromatography, but no nitrate ions detected. Silicon-containing compound #3 had a weight average molecular weight (Mw) of 2,500 versus polystyrene standards.

Synthesis Example 4

A 1000-ml glass flask was charged with 260 g of deionized water and 1 g of 35% hydrochloric acid. A mixture of 70 g of tetramethoxysilane, 25 g of methyltrimethoxysilane, 25 g of a silane compound having formula (i) shown below, and 10 g of phenyltrimethoxysilane was added thereto at room temperature. The mixture was held at room temperature for 8 hours for hydrolytic condensation, after which byproduct methanol was distilled off in vacuum. Then 800 ml of ethyl acetate and 300 ml of propylene glycol monopropyl ether were added, and the water layer was separated off. To the remaining organic layer, 100 ml of deionized water was added, followed by stirring, static holding and separation. This was repeated three times. Propylene glycol monopropyl ether, 200 ml, was added to the organic layer, which was concentrated in vacuum, yielding 300 g of a propylene glycol monopropyl ether solution of silicon-containing compound #4 (polymer concentration 20%). The solution was analyzed by ion chromatography, but no chloride ions detected. Silicon-containing compound #4 had a weight average molecular weight (Mw) of 1,800 versus polystyrene standards.

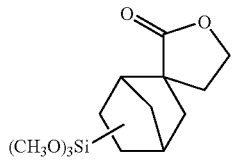

[i]

Synthesis Example 5

A 1000-ml glass flask was charged with 200 g of ethanol, 100 g of deionized water and 3 g of methanesulfonic acid. A mixture of 40 g of tetramethoxysilane, 10 g of methyltrimethoxysilane, 50 g of a silane compound having formula (ii) shown below, and 10 g of phenyltrimethoxysilane was added thereto at room temperature. The mixture was held at room temperature for 8 hours for hydrolytic condensation, after which byproduct methanol was distilled off in vacuum. Then 800 ml of ethyl acetate and 300 ml of propylene glycol monoethyl ether were added, and the water layer was separated off. To the remaining organic layer, 100 ml of deionized water was added, followed by stirring, static holding and separation. This was repeated three times. Propylene glycol monoethyl ether, 200 ml, was added to the organic layer, which was concentrated in vacuum, yielding 300 g of a propylene glycol monoethyl ether solution of silicon-containing compound #5 (polymer concentration 20%). The solution was analyzed for methansulfonate ion by ion chromatography, finding that 99% of the acid used had been removed. Silicon-containing compound #5 had a weight average molecular weight (Mw) of 2,100 versus polystyrene standards.

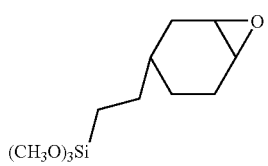

[ii]

Preparation of Silicon Oxide Base Film-Forming Composition

Preparation Examples 1 to 10

Silicon containing film-forming composition solutions, designated Sol. 1 to 10, were prepared by mixing silicon-containing compounds #1 to #5, acid, thermal crosslink promoter, solvent, and additive in accordance with the formulation in Table 1, and filtering through a fluororesin filter having a pore size of 0.1 µm.

TABLE 1

|  |  | No. | Silicon-containing compound, pbw | Thermal crosslink promoter, pbw | Acid, pbw | Solvent, pbw | Water and additional solvent, pbw | Additive, pbw |
|---|---|---|---|---|---|---|---|---|
| Preparation Example | 1 | Sol. 1 | Compound #1 (4.0) | TPSOAc (0.04) | maleic acid (0.04) | propylene glycol monopropyl ether (1600) | water (160) ethanol (80) | nil |
|  | 2 | Sol. 2 | Compound #2 (4.0) | TPSOH (0.04) | oxalic acid (0.02) | propylene glycol monopropyl ether (1600) | water (80) | nil |
|  | 3 | Sol. 3 | Compound #3 (4.0) | TPS-MA (0.4) TMAOAc (0.003) | maleic acid (0.01) | propylene glycol monopropyl ether (1600) | water (80) | nil |
|  | 4 | Sol. 4 | Compound #4 (4.0) | TPS-MA (0.4) TMAOAc (0.003) | maleic acid (0.01) oxalic acid (0.01) | propylene glycol monopropyl ether (1600) | water (80) | nil |
|  | 5 | Sol. 5 | Compound #5 (4.0) | TPSN (0.04) | maleic acid (0.04) oxalic acid (0.01) | propylene glycol monoethyl ther (1600) | water (80) | nil |

TABLE 1-continued

| | No. | Silicon-containing compound, pbw | Thermal crosslink promoter, pbw | Acid, pbw | Solvent, pbw | Water and additional solvent, pbw | Additive, pbw |
|---|---|---|---|---|---|---|---|
| 6 | Sol. 6 | Compound #1 (4.0) | TPS-MA (0.04) | maleic acid (0.01) | propylene glycol monopropyl ether (1600) | water (80) | TPS-Nf (0.02) |
| 7 | Sol. 7 | Compound #1 (4.0) | TPSOAc (0.04) | maleic acid (0.01) | propylene glycol monopropyl ether (1600) | nil | nil |
| 8 | Sol. 8 | Compound #1 (4.0) | nil | maleic acid (0.01) | propylene glycol monopropyl ether (1600) | water (80) | nil |
| 9 | Sol. 9 | Compound #1 (4.0) | nil | maleic acid (0.01) | propylene glycol monopropyl ether (1600) | water (11) | nil |
| 10 | Sol. 10 | Compound #1 (4.0) | TPSOAc (0.04) | maleic acid (0.04) | propylene glycol monopropyl ether (220) | water (22) ethanol (11) | nil |

TPSOAc: triphenylsulfonium acetate (photo-degradable thermal crosslink promoter)
TPSOH: triphenylsulfonium hydroxide (photo-degradable thermal crosslink promoter)
TPS-MA: mono(triphenylsulfonium) maleate (photo-degradable thermal crosslink promoter)
TMAOAc: tetramethylammonium acetate (photo-degradable thermal crosslink promoter)
TPSN: triphenylsulfonium nitrate (photo-degradable thermal crosslink promoter)
TPS-Nf: triphenylsulfonium nonafluorobutanesulfonate (photoacid generator)

Examples 1 to 7 and Comparative Examples 1 to 3

Deposition of Silicon Oxide Base Material Film

A photomask blank was prepared which included a quartz substrate, a phase shift film of MoSiON (Mo:Si:O:N=1:4:1:4 molar ratio) having a thickness of 75 nm and a transmittance of 6% and a phase shift of 180° with respect to light of 193 nm wavelength formed on the substrate, and a light-shielding film of CrN (Cr:N=9:1 molar ratio) having a thickness of 44 nm formed on the phase shift film. Each of Sol. 1 to 10 was spin coated on the blank and baked at 250° C. for 10 minutes to form a silicon-containing film having a thickness of 5 nm.

The mask blank was further baked on a hot plate at 110° C. for 10 minutes. The thickness of the film was measured by means of an optical ellipsometer (J. A. Woollam). Thickness measurement was carried out at 15 points within the surface of the blank substrate excluding the peripheral band extending 10 mm inward from the outer periphery, with an average and a range of film thickness being computed.

Etching Resistance

On the substrate having the silicon oxide base material film formed thereon, an EB lithography chemically amplified resist liquid SEBP-9012 (Shin-Etsu Chemical Co., Ltd.) was coated to a thickness of 90 nm, using a spin coater.

Using an EB mask writer system EBM5000 (NuFlare Technology, Inc., accelerating voltage 50 keV), the resist was exposed to EB, post-exposure baked (PEB) at 110° C. for 10 minutes, and developed with an aqueous solution of 2.38 wt % tetramethylammonium hydroxide, forming a positive pattern including a 200-nm line-and-space pattern and 100-nm line pattern. Exposure was made at an optimum dose (sensitivity Eop) that provided a 1:1 revolution at the top and bottom of the 200-nm line-and-space pattern.

Etching resistance was evaluated as follows. Using a dry etching apparatus, with the resist pattern serving as a mask, the silicon-containing film exposed through the resist pattern was dry etched and patterned under the following fluorine dry etching conditions.

Etching conditions of silicon-containing film

| | |
|---|---|
| RF1 (RIE): | CW 54 V |
| RF2 (ICP): | CW 325 W |
| Pressure: | 5 mTorr |
| SF$_6$: | 18 sccm |
| O$_2$: | 45 sccm |
| Etching time: | 1 min |

Next, the resist pattern was stripped by oxygen plasma. Using the patterned silicon-containing film as a mask, the Cr light-shielding film exposed through the pattern was dry etched and patterned under the following chlorine dry etching conditions.

Etching conditions of Cr light-shielding film

| | |
|---|---|
| RF1 (RIE): | pulse 700 V |
| RF2 (ICP): | CW 400 W |
| Pressure: | 6 mTorr |
| Cl$_2$: | 185 sccm |
| O$_2$: | 55 sccm |
| He: | 9.25 sccm |
| Etching time: | 7 min |

Next, using the patterned Cr light-shielding film as a mask, the phase shift film of MoSiON (Mo:Si:O:N=1:4:1:4 molar ratio) exposed through the pattern was dry etched and patterned under the following fluorine dry etching conditions, to thereby form a mask pattern. At the same time, the patterned silicon-containing film overlying the patterned Cr light-shielding film was removed by dry etching.

Etching conditions of MoSiON phase shift film

| | |
|---|---|
| RF1 (RIE): | CW 54 V |
| RF2 (ICP): | CW 325 W |
| Pressure: | 5 mTorr |
| SF$_6$: | 18 sccm |
| O$_2$: | 45 sccm |
| Etching time: | 2 min |

The pattern of phase shift film resulting from etching was measured for line edge roughness (LER), and by defect inspection, the area which was not subjected to resist patterning was observed for any residues of the silicon-containing film. Specifically, the LER was measured under SEM S-8840 (Hitachi, Ltd.) at 50 points along a longitudinal distance of 5 μm of the 100-nm line pattern, with a value of 3σ being computed. A lower value indicates better performance. For defect inspection, a mask blank inspection system Magics M1320 (Lasertec Corp.) was used to count the number of defects within 10 cm square (square region of 10 cm×10 cm). A lower value indicates better performance.

TABLE 2

| | Composition | Thickness of silicon-containing film | LER | Defect count within 10 cm square |
|---|---|---|---|---|
| Example 1 | Sol. 1 | 5 nm | 2 nm | <10 |
| Example 2 | Sol. 2 | 5 nm | 2 nm | <10 |
| Example 3 | Sol. 3 | 5 nm | 2 nm | <10 |
| Example 4 | Sol. 4 | 5 nm | 2 nm | <10 |
| Example 5 | Sol. 5 | 5 nm | 2 nm | <10 |
| Example 6 | Sol. 6 | 5 nm | 2 nm | <10 |
| Example 7 | Sol. 7 | 5 nm | 2 nm | <10 |
| Comparative Example 1 | Sol. 8 | 5 nm | 8 nm | <10 |
| Comparative Example 2 | Sol. 9 | 40 nm | 4 nm | >50 |
| Comparative Example 3 | Sol. 10 | 40 nm | 2 nm | >50 |

The data in Table 2 demonstrate that in photomask blanks having a silicon-containing film formed of the composition having a crosslink promoter added thereto within the scope of the invention, the silicon-containing film exhibits sufficient resistance to chlorine dry etching even though the film is thin, ensuring accurate processing of a light-shielding film of chromium base material. The pattern once transferred to the chromium base material film is further transferred to the phase shift film of metallic silicon base material, resulting in a line pattern with minimal LER. In contrast, a photomask blank having a silicon-containing film formed of the composition free of crosslink promoter fails in high-accuracy pattern transfer in the processing of a light-shielding film of chromium base material when the silicon-containing film has a thickness of 5 nm, resulting in a line pattern with increased LER. In the event that the silicon-containing film has a thickness of 40 nm, Comparative Example 2 having a silicon-containing film of the same material as in Comparative Example 1 is improved in LER, but increased in defect count because residues form after stripping of the silicon-containing film.

Japanese Patent Application No. 2009-078642 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A photomask blank comprising:
a transparent substrate;
a film formed on the transparent substrate, the film consisting of one or more layers including an uppermost layer composed of a chromium base material; and
an etching mask film on the uppermost layer, the etching mask film serving as an etching mask for the uppermost layer upon chlorine dry etching, wherein
said etching mask film is deposited from a silicon oxide base material film-forming composition comprising:
(A) a hydrolytic condensate of a hydrolyzable silane compound;
(B) a compound having the general formula (1) or (2):

$$L_a H_b X \tag{1}$$

wherein L is lithium, sodium, potassium, rubidium or cesium, X is a hydroxyl group or a mono- or polyfunctional organic acid group of 1 to 30 carbon atoms, a is an integer of at least 1, b is 0 or an integer of at least 1, and a+b is equal to the functionality of the hydroxyl or organic acid group, $$MA \tag{2}$$

wherein M is tertiary sulfonium, secondary iodonium or quaternary ammonium, and A is a non-nucleophilic counter ion; and
(C) an organic solvent, and
said etching mask film has a thickness of 1 to 10 nm.
2. The photomask blank of claim 1 wherein the hydrolyzable silane compound is a hydrolyzable silane compound having the general formula (3) alone or a mixture of two or more hydrolyzable silane compounds containing at least 70 mol % on silicon basis of the hydrolyzable silane compound of formula (3), $$R_n SiZ_{4-n} \tag{3}$$

wherein R is hydrogen or an aliphatic hydrocarbon group of 1 to 12 carbon atoms or aromatic hydrocarbon group, Z is an alkoxy group of 1 to 4 carbon atoms, halogen atom, or alkylcarbonyloxy group of 2 to 5 carbon atoms, and n is 0 or 1.
3. A method for processing a photomask blank comprising:
a transparent substrate;
a film formed on the transparent substrate, the film consisting of one or more layers including an uppermost layer composed of a chromium base material; and
an etching mask film on the uppermost layer, the etching mask film serving as an etching mask for the uppermost layer upon chlorine dry etching, wherein
said etching mask film is deposited from a silicon oxide base material film-forming composition comprising:
(A) a hydrolytic condensate of a hydrolyzable silane compound;
(B) a compound having the general formula (1) or (2):

$$L_a H_b X \tag{1}$$

wherein L is lithium, sodium, potassium, rubidium or cesium, X is a hydroxyl group or a mono- or polyfunctional organic acid group of 1 to 30 carbon atoms, a is an integer of at least 1, b is 0 or an integer of at least 1, and a+b is equal to the functionality of the hydroxyl or organic acid group, $$MA \tag{2}$$

wherein M is tertiary sulfonium, secondary iodonium or quaternary ammonium, and A is a non-nucleophilic counter ion; and
(C) an organic solvent, and
said etching mask film has a thickness of 1 to 10 nm,
the method comprising the steps of:
forming a resist pattern on the photomask blank;

effecting fluorine dry etching on the photomask blank through the resist pattern, for transferring the resist pattern to the etching mask film; and effecting chlorine dry etching on the photomask blank through the etching mask film pattern thus transferred, for transferring the pattern to the uppermost layer of chromium base material.

4. A method for etching a film formed on a transparent substrate, the film consisting of one or more layers including an uppermost layer composed of a chromium base material, said method comprising chlorine dry etching using a silicon oxide base material film on the uppermost layer as an etching mask, wherein said silicon oxide base material film is deposited from a film-forming composition comprising:

(A) a hydrolytic condensate of a hydrolyzable silane compound;

(B) a compound having the general formula (1) or (2);

$$L_a H_b X \tag{1}$$

wherein L is lithium, sodium, potassium, rubidium or cesium, X is a hydroxyl group or a mono- or polyfunctional organic acid group of 1 to 30 carbon atoms, a is an integer of at least 1, b is 0 or an integer of at least 1, and a+b is equal to the functionality of the hydroxyl or organic acid group, $$MA \tag{2}$$

wherein M is tertiary sulfonium, secondary iodonium or quaternary ammonium, and A is a non-nucleophilic counter ion; and (C) an organic solvent, said silicon oxide base material film as an etching mask film has a thickness of 1 to 10 nm.

5. The method of claim 4 wherein the hydrolyzable silane compound is a hydrolyzable silane compound having the general formula (3) alone or a mixture of two or more hydrolyzable silane compounds containing at least 70 mol % on silicon basis of the hydrolyzable silane compound of formula (3), $$R_n SiZ_{4-n} \tag{3}$$

wherein R is hydrogen or an aliphatic hydrocarbon group of 1 to 12 carbon atoms or aromatic hydrocarbon group, Z is an alkoxy group of 1 to 4 carbon atoms, halogen atom, or alkylcarbonyloxy group of 2 to 5 carbon atoms, and n is 0 or 1.

* * * * *